United States Patent
Han et al.

(10) Patent No.: US 6,246,610 B1
(45) Date of Patent: Jun. 12, 2001

(54) SYMMETRICAL PROGRAM AND ERASE SCHEME TO IMPROVE ERASE TIME DEGRADATION IN NAND DEVICES

(75) Inventors: K. Michael Han, San Jose, CA (US); Joseph G. Pawletko, Germantown, MD (US); Narbeh Derhacobian, Belmont; Chi Chang, Redwood City, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/511,652

(22) Filed: Feb. 22, 2000

(51) Int. Cl.[7] .............................. G11C 16/04; G11C 16/06
(52) U.S. Cl. .................... 365/185.29; 365/185.22; 365/185.28
(58) Field of Search ................... 365/185.17, 185.18, 365/185.22, 185.28, 185.29

(56) References Cited

U.S. PATENT DOCUMENTS

| | | | |
|---|---|---|---|
| 5,299,162 | * 3/1994 | Kim et al. | 365/185.21 |
| 5,410,511 | 4/1995 | Michiyama | 365/218 |
| 5,523,972 | 6/1996 | Rashid et al. | 365/185.22 |
| 5,528,546 | 6/1996 | Chao et al. | 365/185.21 |
| 5,621,687 | 4/1997 | Doller | 365/185.29 |
| 5,661,685 | 8/1997 | Lee et al. | 365/185.22 |
| 5,677,885 | 10/1997 | Roohparvar | 365/201 |
| 5,734,609 | * 3/1998 | Choi et al. | 365/185.17 |
| 5,740,107 | * 4/1998 | Lee | 365/185.11 |
| 5,784,316 | 7/1998 | Hirata | 365/185.22 |
| 5,798,547 | 8/1998 | Urai | 257/316 |
| 5,801,989 | 9/1998 | Lee et al. | 365/185.22 |
| 5,812,457 | 9/1998 | Arase | 365/185.22 |
| 5,844,840 | 12/1998 | Le et al. | 365/185.23 |
| 5,852,576 | 12/1998 | Le et al. | 365/185.33 |
| 5,880,996 | 3/1999 | Roohparvar | 365/185.33 |
| 5,892,710 | 4/1999 | Fazio et al. | 365/185.03 |
| 5,920,508 | 7/1999 | Miyakawa et al. | 365/185.22 |
| 5,946,231 | * 8/1999 | Endoh et al. | 365/185.03 |
| 5,949,714 | * 9/1999 | Hemink et al. | 365/185.17 |
| 5,953,255 | * 9/1999 | Lee | 365/185.29 |
| 5,963,476 | 10/1999 | Hung et al. | 365/185.22 |
| 6,052,306 | 4/2000 | Sedlak et al. | 365/185.19 |
| 6,088,281 | 7/2000 | Miyakawa et al. | 365/225.7 |

* cited by examiner

Primary Examiner—Son Mai
(74) Attorney, Agent, or Firm—Skjerven Morrill MacPherson LLP; Edward C. Kwok; David C. Hsia

(57) ABSTRACT

A programming and erase method that extends erase time degradation of nonvolatile memory devices by using a constant erase voltage and a set of program voltages, where the average program voltage of the set of the program voltages is approximately equal to the constant erase voltage.

13 Claims, 11 Drawing Sheets

SYMMETRICAL PROGRAM AND ERASE SCHEME TO IMPROVE ERASE TIME DEGRADATION IN NAND DEVICES

FIELD OF THE INVENTION

The present invention is directed to methods to program and erase a memory cell.

RELATED ART

FIG. 1 illustrates a cross sectional view of a conventional memory transistor, also known as a memory cell. The memory transistor includes a control gate CG, a floating gate FG, a drain D, a source S, and a well W. Thin oxide layers isolate the floating gate FG from the control gate CG as well as the well W.

FIG. 2 schematically illustrates a conventional NAND type flash memory array 100 that includes numerous memory cells, each depicted in FIG. 1. A "string" includes a selection transistor $T_{i-1}$, memory transistors $M_{i-1}$ to $M_{i-j}$, and a selection transistor $T_{i-2}$, all being serially coupled. Each string can be coupled to a bit line BLj and a common source CS through selection transistors $T_{i\_1}$ and $T_{i-2}$, respectively. The control gates for selection transistors $T_{i-1}$ and $T_{i-2}$ are respectively connected to selection lines $Sl_1$ and $Sl_2$. The control gates for the memory transistors $M_{i-1}$ to $M_{i-j}$ are respectively connected to word lines $W_1$ to $W_j$. Typically, a read operation is performed on a page basis, i.e., flash memory cells coupled to a word line are read together.

Herein, a memory transistor represents logical LOW when it is programmed to have a threshold voltage that is larger than a predetermined minimum threshold voltage for logical LOW bits. Correspondingly, a memory transistor represents a logical HIGH when it is erased to have a threshold voltage that is less than a predetermined maximum threshold voltage for logical HIGH bits. One skilled in the art will understand that logic level assignments to the predetermined minimum and maximum threshold voltages are arbitrary.

A large variation in the programming and erasing characteristics of individual NAND type flash memory transistors among a memory array is common. The variations can be due to structural differences, which cause difference in threshold voltage characteristics. Such variations introduce differences in programming and erasing speeds among memory transistors. Conventional NAND type flash memory arrays use fixed programming and erase voltages that cannot adjust to programming and erasing characteristics of the memory transistors. Some memory transistors in flash memory arrays do not respond to the fixed programming and erase voltages of NAND type flash memory arrays. Accordingly, NAND type flash memory arrays that include an intolerably high number of non-responsive memory cells are typically discarded. As such, the yield of usable NAND memory arrays fluctuates. Low yield increases the manufacturing cost of NAND memory, and hence leads to a less profitable and less competitive position.

Thus what is needed is a method and apparatus to adaptively control the programming and erase voltages of NAND type flash memory and thereby increase the proportion of usable memory cells.

SUMMARY

In one embodiment of the present invention, a method for programming and erasing a nonvolatile memory device comprises applying a program voltage and applying an erase voltage, where the program voltage is approximately equal to the erase voltage.

In another embodiment of the present invention, a method for programming and erasing a nonvolatile memory device comprises applying a set of program voltages and applying an erase voltage, where the average voltage of the set of program voltages is approximately equal to the erase voltage.

In another embodiment of the present invention, a method for selecting program voltages and an erase voltage for a nonvolatile memory device comprises determining a set of program voltages that programs the nonvolatile memory device within a first specified time, determining an erase voltage that erases the nonvolatile memory device within a second specified time, and determining if the average voltage of the set of program voltages is approximately equal to the erase voltage.

It is believed that the above methods provide a symmetry in the program and erase voltages that slows erase time degradation, thereby extending the usable program/erase cycles of nonvolatile memory devices.

Various embodiments of the present invention will be more fully understood in light of the following detailed description taken together with the accompanying drawings.

BRIEF DESCRIPTION OF THE DRAWINGS

Note that use of the same reference numbers in different figures indicates the same or like elements.

DETAILED DESCRIPTION

Figure 1:
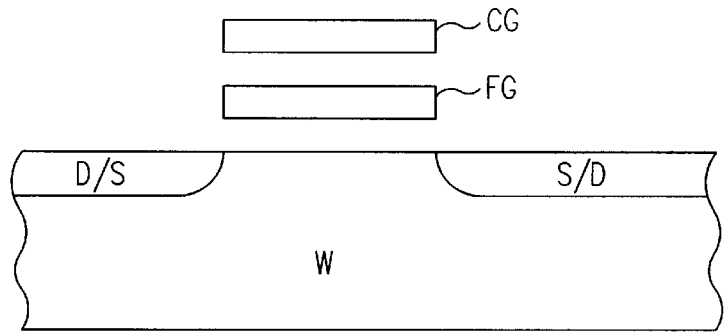
FIG. 1 illustrates a cross sectional view of a conventional memory transistor, also known as a memory cell.
Figure 2:
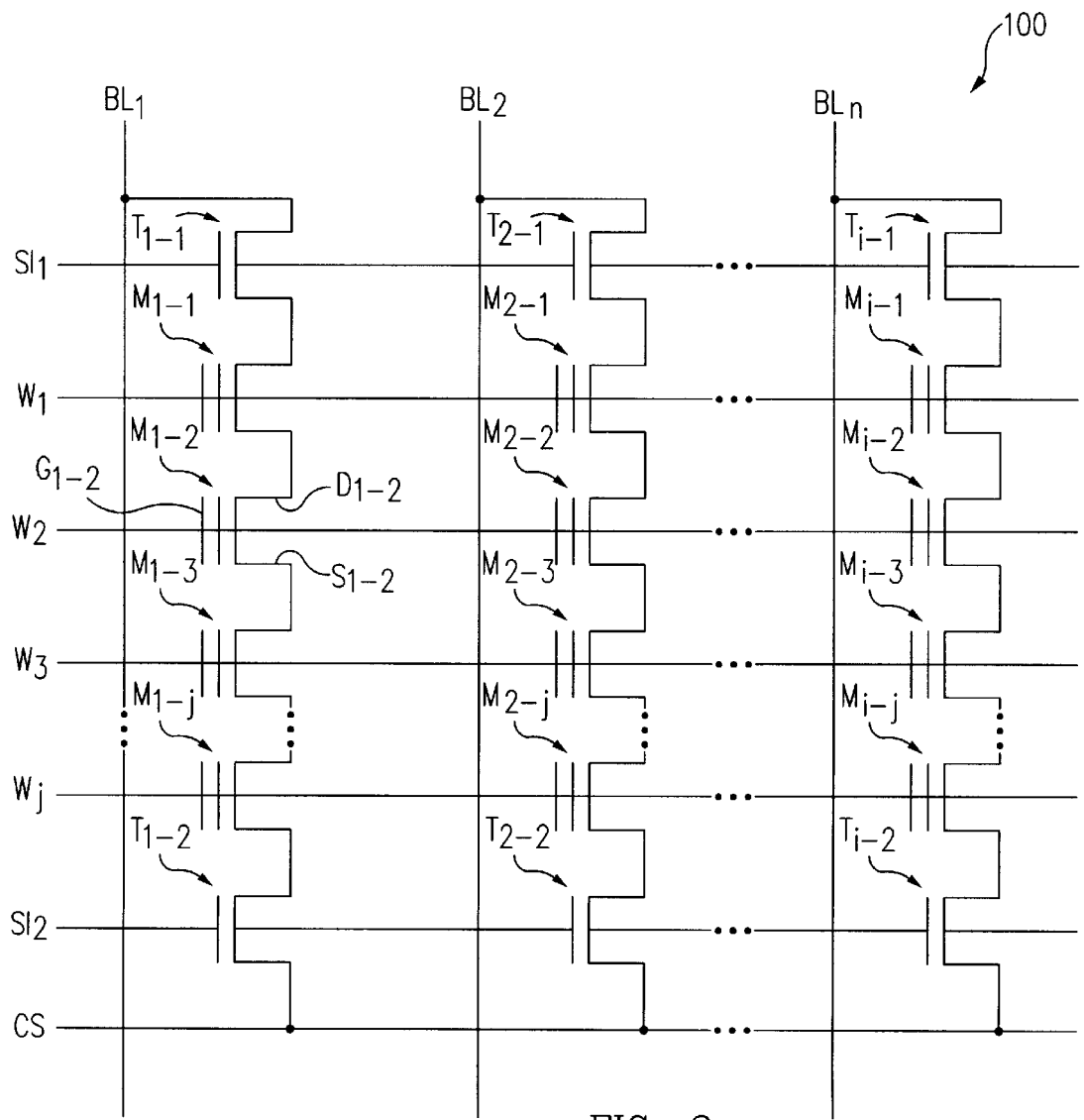
FIG. 2 illustrates a schematic of a conventional NAND type memory array that includes numerous memory cells depicted in FIG. 1.
Figure 3:
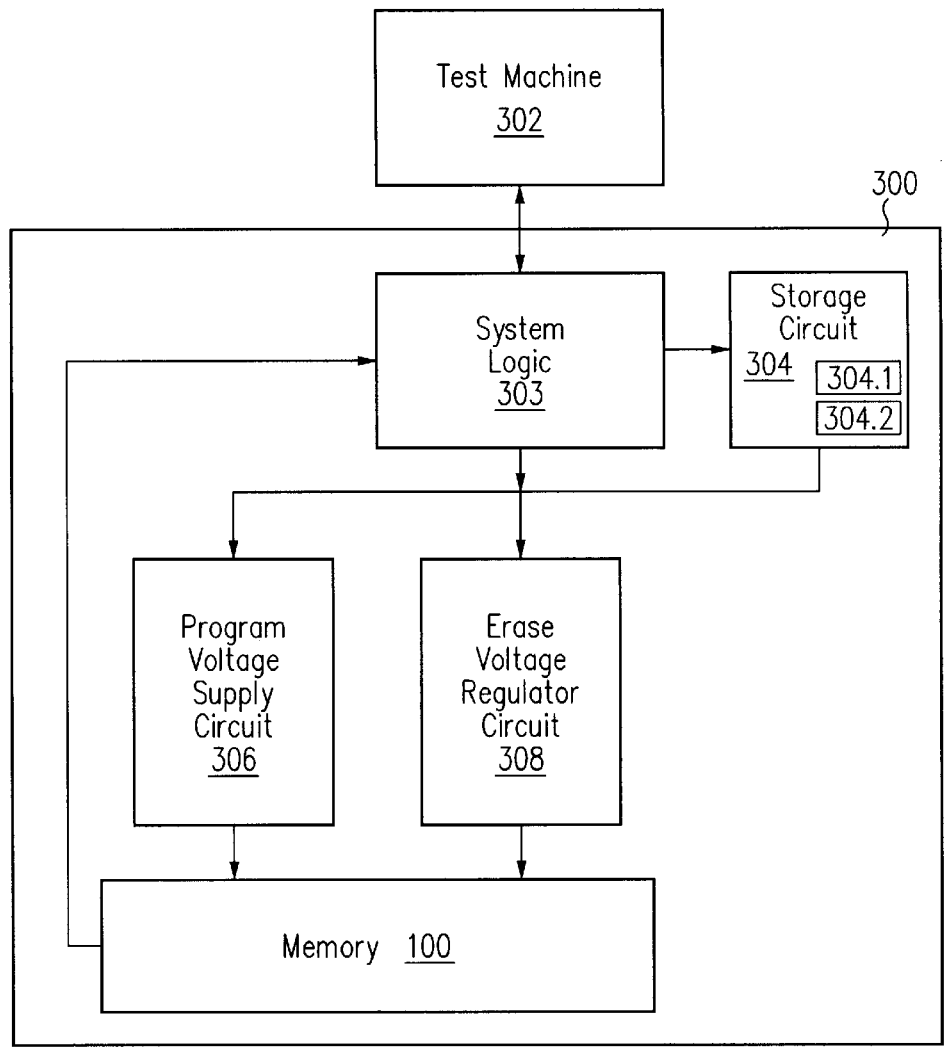
FIG. 3 illustrates a schematic of a memory system in accordance with an embodiment of the present invention.

FIG. 3 schematically depicts a memory system 300 in accordance with an embodiment of the present invention. Memory system 300 includes conventional memory array such as memory array 100, described earlier; system logic 303 that supports test and user mode operations, both described in more detail later; program voltage supply circuit 306 that programs selected memory cells of memory array 100; erase voltage regulator circuit 308 that erases selected memory cells of memory array 100; and storage circuit 304, that specifies program and erase voltage values used by respective program voltage regulator circuit 306 and erase voltage regulator circuit 308.

In this embodiment, memory system 300 operates in either a "test" mode or a "user" mode. In test mode, an optimal initial program voltage is determined. In one embodiment, in test mode, an optimal initial erase voltage is determined. The operation of memory system 300 in test mode is described in more detail later. Subsequently, in user mode, the optimal initial program voltage is used during program operations. In one embodiment, in user mode, the optimal initial erase voltage is used during erase operations. The operation of memory system 300 in user mode is described in more detail later.

System Logic 303

In this embodiment, system logic 303 includes hardwired logic that supports test and user mode operations, both described herein. Of course, system logic 303 could be implemented in software executed by a microprocessor.

Address Decoder

Of course, though not depicted, conventional X and Y address decoders are used. For an exemplary X-decoder, see U.S. Pat. No. 5,852,576, entitled "High voltage NMOS pass gate for integrated circuit with high voltage generator and flash non-volatile memory device having the pass gate," inventors Le et al. and U.S. Pat. No. 5,844,840, entitled "High voltage NMOS pass gate having supply range, area, and speed advantages," inventors Le et al., which are incorporated herein by reference in their entirety.

Page Buffer

Of course, a conventional page buffer is used to identify and/or specify the state of selected memory cells. For a suitable page buffer, see U.S. patent application Ser. No. 09/420,209, entitled "Programmable Current Source," inventors Hollmer et al., filed Oct. 18, 1999, which is incorporated herein by reference in its entirety.

Storage Circuit 304

Storage circuit 304 includes program voltage storage element 304.1 and erase voltage storage element 304.2, that store respective initial programming voltage and initial erase voltage. The programming and erase voltages and reference current levels are determined, e.g., during test mode.

A suitable implementation of each of elements 304.1 and 304.2 is a conventional memory array, (storing, e.g., 5 bits), each being a similar structure as the memory array, described earlier.

In one embodiment storage circuit 304 also stores a reference current value, used by a reference current source, described later.

Program Voltage Supply Circuit 306

Figure 4:
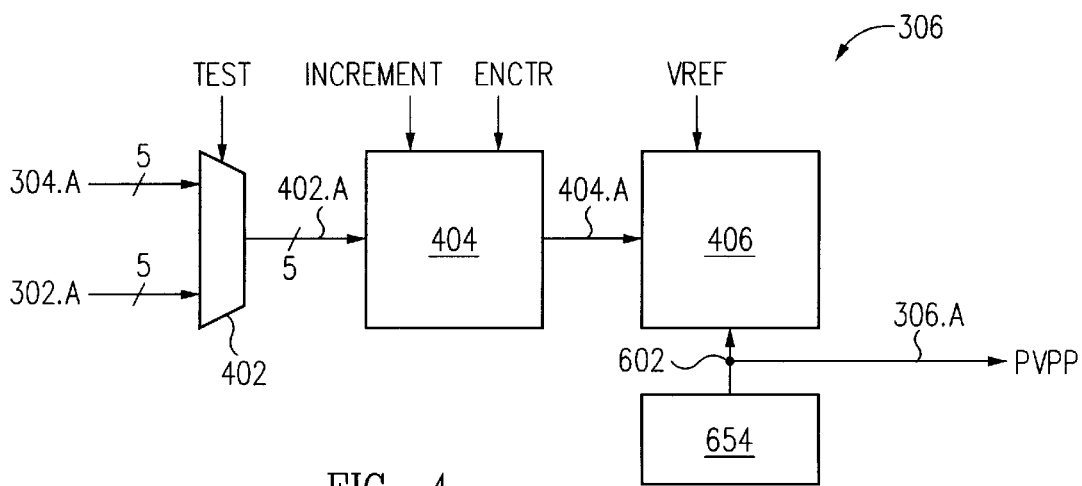
FIG. 4 illustrates a schematic of a program voltage supply circuit in accordance with an embodiment of the present invention.

FIG. 4 schematically depicts a suitable embodiment of program voltage supply circuit 306, in accordance with an embodiment of the present invention. Selector circuit 402 is a conventional multiplexer that transfers a voltage value (signal 302.A) set by test machine 302, when signal TEST is HIGH, or otherwise transfers a voltage value (signal 304.B) from storage circuit 304.

Counter circuit 404 receives a voltage value 402.A from selector circuit 402 and provides an input voltage value 404.A to program voltage regulator circuit 406. Counter circuit 404 selectively increments input value 404.A.

Program voltage regulator circuit 406 controls voltage output of charge pump 654 according to input voltage value 404.A. Charge pump 654 outputs a voltage signal PVPP to a selected word line of memory array 100.

Counter Circuit 404

Figure 5A:
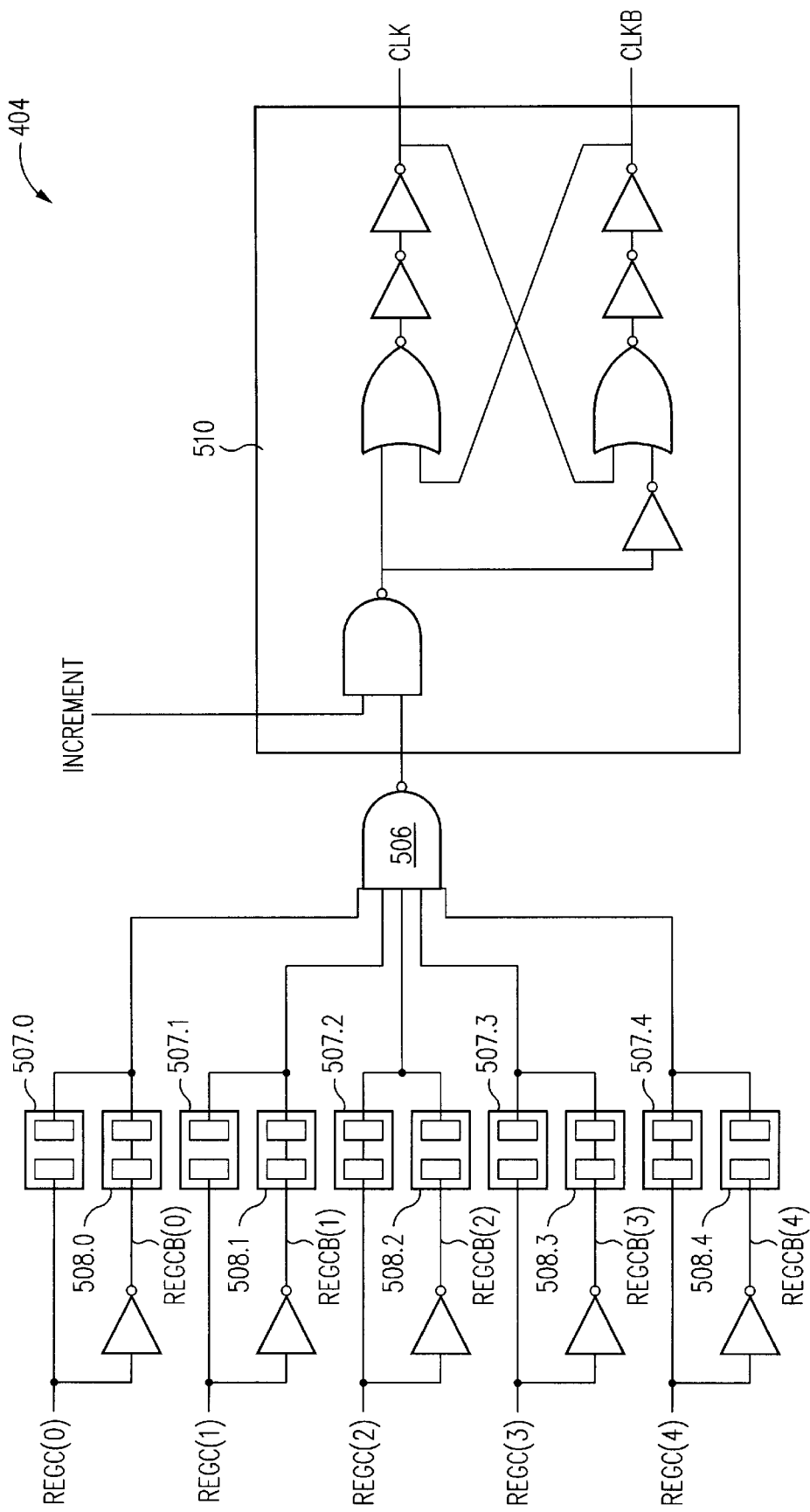
FIGS. 5A and 5B illustrate schematics of a counter circuit of FIG. 4 in accordance with an embodiment of the present invention.
Figure 5B:
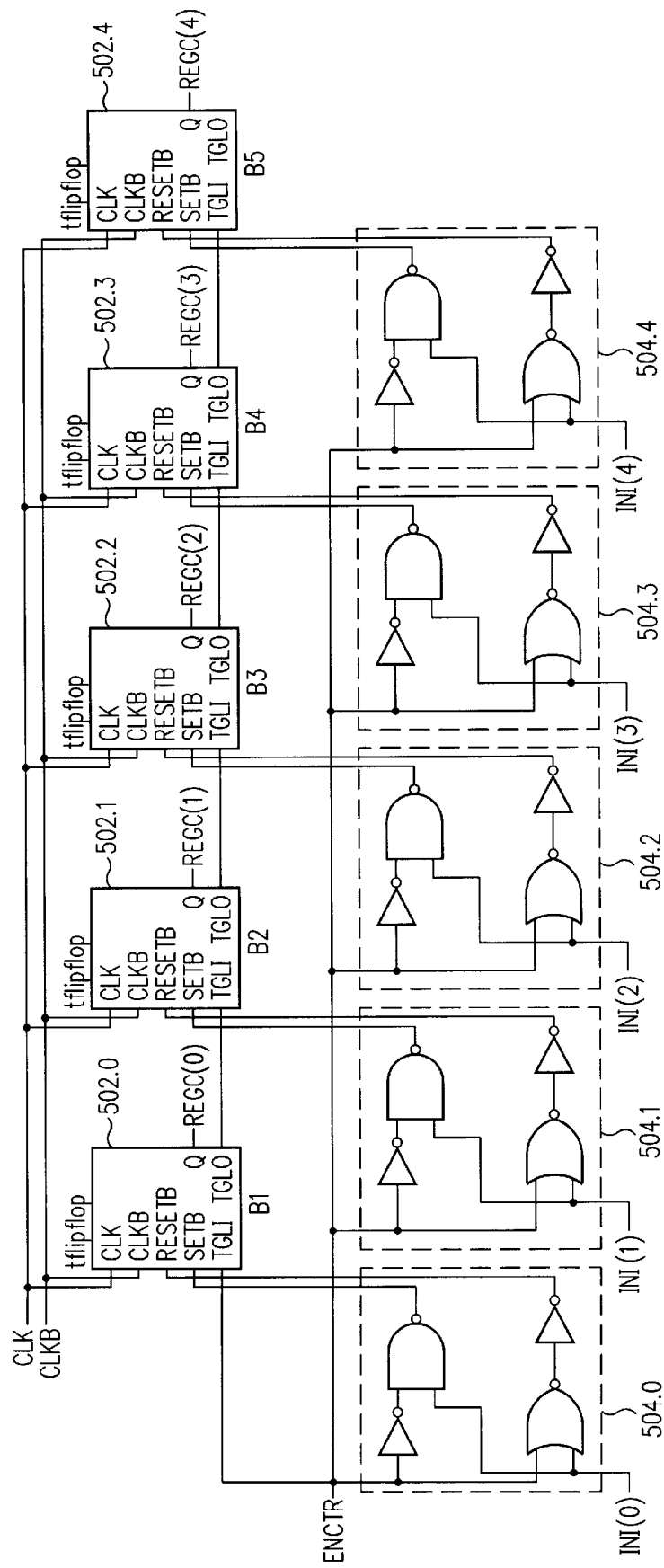

FIGS. 5A and 5B depict a suitable implementation of counter circuit 404. In this embodiment, conventional counter circuit 404 is used in user mode to generate stepped program voltage values. In test mode, counter circuit 404 does not increment its input but transfers the input value.

Each of signals INI(0) to INI(4) represents a bit of input voltage value 402.A. For signals INI(0) to INI(4), the number in parentheses represents the bit position of signal 402.A represented. Signal INI(0) represents the least significant bit of signal 402.A. Signals REGC(0) to REGC(4) each represent a bit of output signal 404.A. Signals REGCB(0) and REGCB(4) are the compliments of signals REGC(0) to REGC(4).

Flip flops 502.0 to 502.4 each are a conventional "T" type flip flop. Each of flip flops 502.0 to 502.4 includes input terminals labeled CLK, CLKB, RESETB, SETB, and TGLI. Outputs TGLO from respective flip flops 502.0 to 502.3 are inputs to ports TGLI of respective flip flops 502.1 to 502.4.

When signal ENCTR is logical LOW, circuits 504.0 to 504.4 transfer respective input signals INI(0) to INI(4) to respective flip flops 502.0 to 502.4. When signal ENCTR is logical HIGH, circuits 504.0 to 504.4 are disconnected from flip flops 502.0 to 502.4.

When signal CLKB shifts from LOW to HIGH, counter circuit 404 increments the voltage value represented by INI(0) to INI(4), until reaching 11111. Counter circuit 404 outputs the voltage value represented by REGC(0) to REGC(4).

To stop the increment of signals REGC(0) to REGC(4) prior to reaching 11111, metal options 507.0 to 507.4 on respective signals REGC(0) to REGC(4), and metal options 508.0 to 508.4 on respective signals REGCB(0) to REGCB(4) may be set according to a maximum value desired, where signals REGC(0) to REGC(4) and signals REGCB(0) to REGCB(4) are inputs for a NAND gate 506. For example, if the maximum value of signals REGC(0) to REGC(4) is selected as 10100, metal options 507.2 and 507.4 on signals REGC(2) and REGC(4), and metal options 508.0, 508.1, and 508.3 on signals REGCB(0), REGCB(1), and REGCB(3), are set during fabrication to prevent signals REGC(0) to REGC(4) from exceeding 10100.

The output of NAND gate 506 and a signal INCREMENT from system logic 303 are coupled to a clock circuit 510 that generates signals CLK and CLKB.

Program Voltage Regulator Circuit 406

Figure 6:
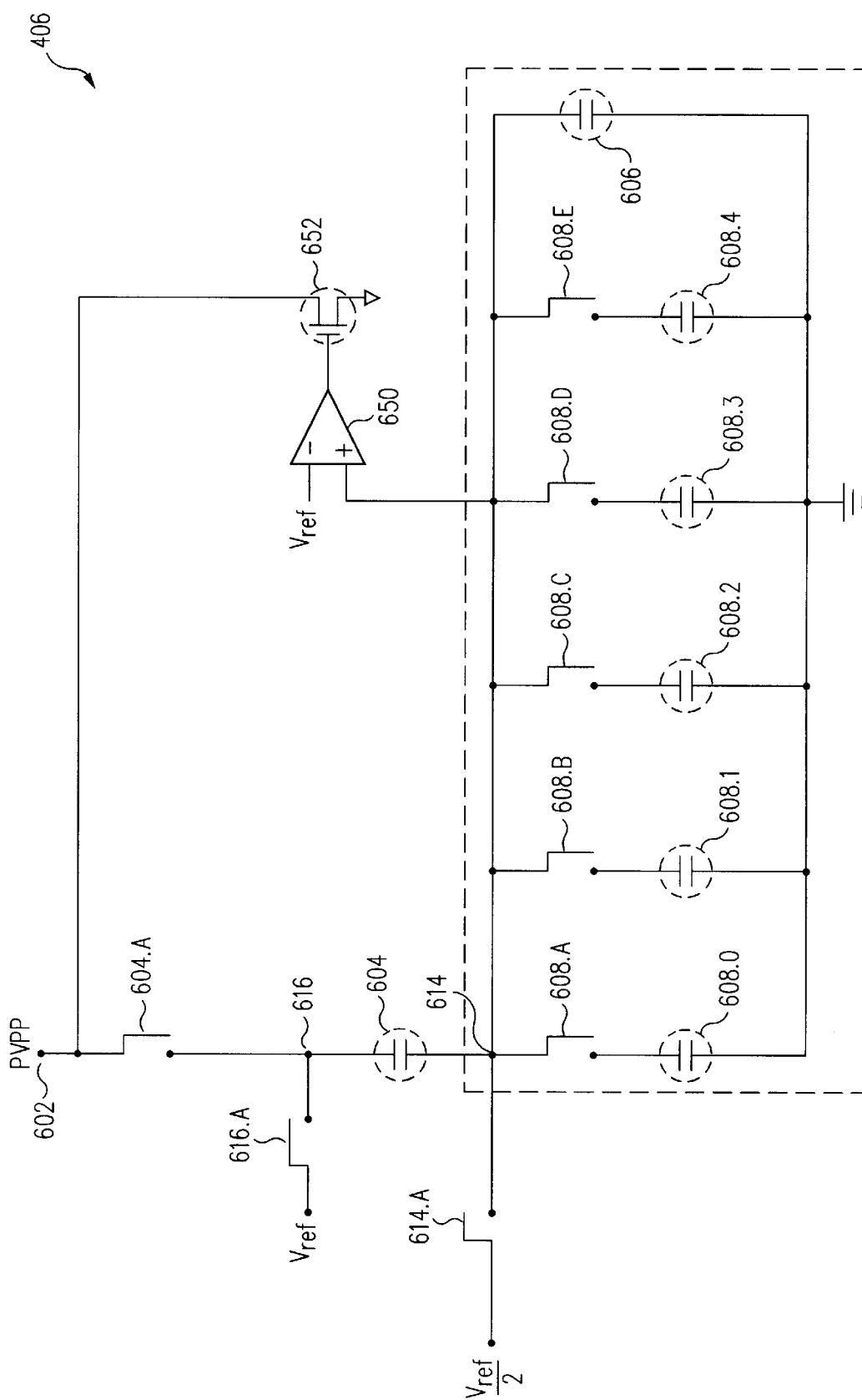
FIG. 6 illustrates a schematic of a voltage regulator circuit of FIG. 4 in accordance with an embodiment of the present invention.

Program voltage regulator circuit 406 controls the voltage at node 602 to be commensurate to the value of REGC(0) to REGC(4) from counter circuit 404. FIG. 6 depicts a suitable implementation of program voltage regulator circuit 406.

A suitable implementation of program voltage regulator circuit 406 includes a conventional comparator circuit 650 coupled to receive inputs of a signal Vref, a band gap voltage of, e.g., 1.3 V, and a signal at node 614, which is a portion of the voltage at node 602 as divided by a proportion of capacitance of capacitive element 604 to the total capacitance at node 614. The output of comparator circuit 650 is coupled to a gate terminal of, for example, a NMOS transistor 652.

In this embodiment, a conventional charge pump 654 is coupled to node 602 of program voltage regulator circuit 406. In this embodiment, charge pump 654 is capable of providing a voltage to node 602 of approximately 20 V. The combination of comparator circuit 650 and transistor 652 regulates the voltage at node 602 so that if the voltage at node 602 is too high, comparator circuit 650 turns on transistor 652, which discharges node 602 to the desired voltage (the regulated value). In this embodiment, node 602 is coupled to a selected word line.

The voltage at node 614 is controlled by use of capacitive elements 604, 606, and 608.0 to 608.4. The higher the combined capacitance of elements 606 and 608.0 to 608.4 relative to that of element 604, the higher the voltage at node 614. Switch 604.A controls whether capacitive element 604 is coupled in series with node 602. Switches 608.x, where x is A to E, control whether respective capacitive elements 608.0 to 608.4 are coupled to node 614. Thus switches 604.A and 608.A to 608.E control the connection of capacitive elements to node 602 and thus control a voltage level at node 602. Herein, with respect to any switch or latch, "closing" a switch allows current through the switch or latch.

Signals REGC(0) to REGC(4) control the closing of respective latches 608.A to 608.E. When a signal REGC(z), where z is any of 0 to 4, is a logical HIGH, respective latch 608.z closes.

Providing voltages Vref and Vref/2 to respective nodes 616 and 614 charges the capacitive elements. Switches 616.A and 614.A control whether respective nodes 616 and 614 are coupled to respective voltages Vref and Vref/2. In this embodiment, system logic 302 controls switches 616.A and 614.A and thereby controls coupling of respective voltages Vref and Vref/2.

In this embodiment, switches 614.A and 616.A are closed except during program or program verify commands, described later, thereby initializing all capacitors before the capacitor divider is used.

In this embodiment a ratio of capacitance of capacitive elements 608.0 to 608.4 is 1:2:4:8:16. The capacitance of capacitive elements 604, 606, and 608.0 to 608.4 are chosen to create a desired voltage at node 614.

Without any switches closed, capacitive elements 604 and 606 divide the voltage at node 602. Incrementing the value represented by REGC(0) to REGC(4) increases the capacitance at node 614 by adding capacitive elements 608.0 to 608.4 in parallel with capacitive element 606. Increasing the capacitance at node 614 decreases the ratio of voltages between nodes 614 and 602. Decreasing the ratio of voltages between nodes 614 and 602, while maintaining the voltage at nodes 614 with Vref, increases the voltage at node 602. As previously described, transistor 652 is used to maintain the voltage at node 602 at the desired voltage.

In this embodiment, for each increment of REGC(0) to REGC(4), voltage at node 602 increases by a fixed increment until reaching a maximum programming voltage prescribed by the previously described metal options 507.0 to 507.4 and metal options 508.0 to 508.4. Metal options 507.0 to 507.4 and metal options 508.0 to 508.4 are used to set a maximum programming voltage that will program a desired quantity of memory cells but will not create intolerable memory cell damage.

Of course, the capacitance level of capacitive elements can be varied to produce desired incremental voltages at node 602. The voltage output per incremental bit of the input represented by REGC(0) to REGC(4) is calculated by 1) determining an acceptable range of programming voltages required to program selected memory cells and then 2) dividing the voltage range by $2^n$, where n represents a number of bits in REGC(0) to REGC(4), i.e., 5.

Nonlinear Voltage Incrementing

Figure 7:
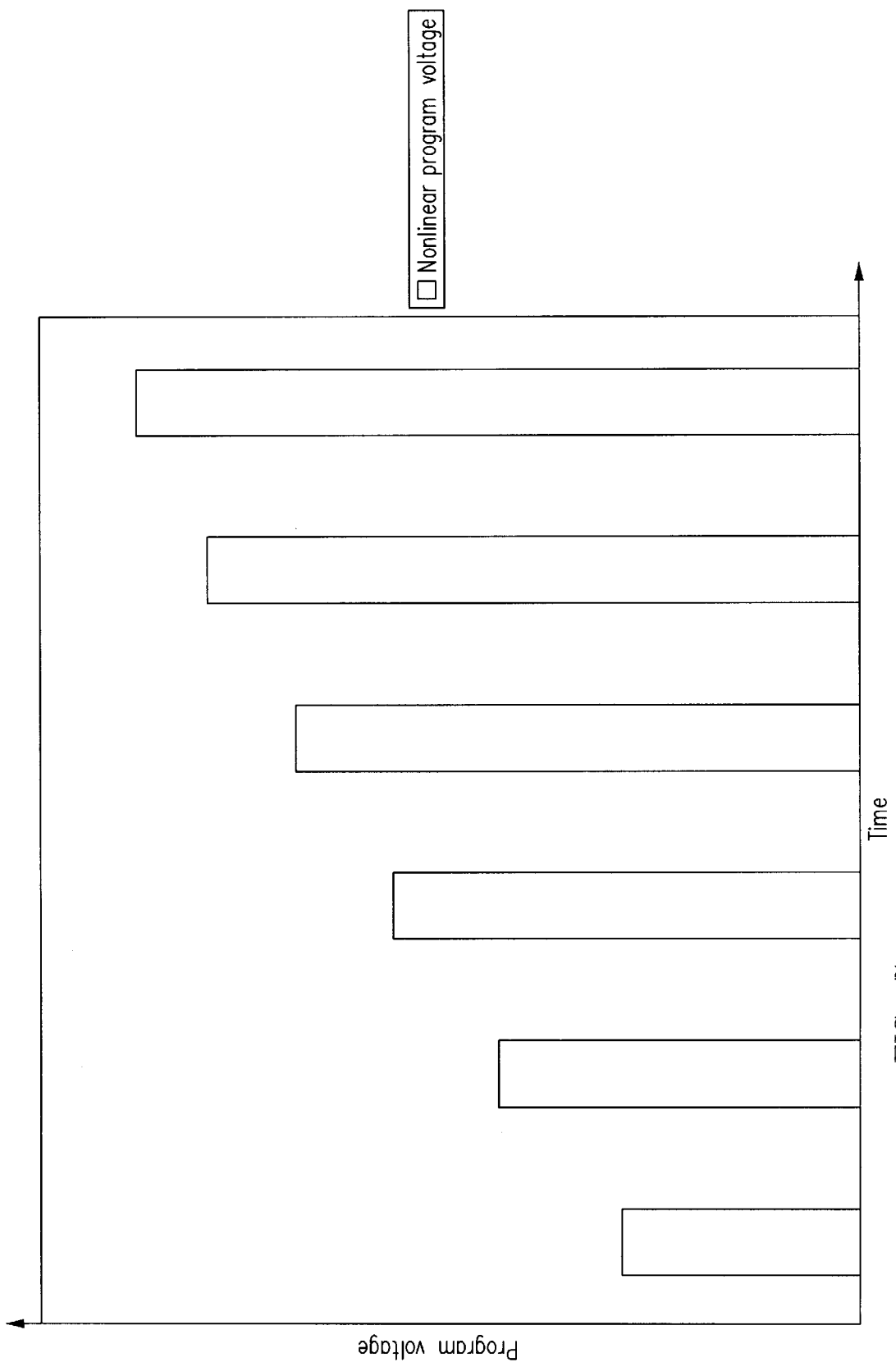
FIG. 7 illustrates a schematic of a graph of a nonlinear incremented programming voltage in accordance with an embodiment of the present invention.

In one embodiment, for any program operation in user mode, the voltage at node 602 is increased by decreasing increments each programming operation. FIG. 7 illustrates such a nonlinear incremented programming voltage.

Compared to a linearly incremented programming voltage, the nonlinearly incremented programming voltage may produce a tighter distribution of the threshold voltages because it increases the threshold voltages in a smaller amount each programming iteration, thereby decreasing the amount the threshold voltages exceed the predetermined minimum threshold voltage for logical LOW bits. A narrow distribution of threshold voltages is desirable because it increases the read margin, i.e., the threshold voltage difference, between logical LOW and logical HIGH bits. Furthermore, a nonlinearly incremented programming voltage may subject the memory transistors to lower programming voltages and improve the reliability of the memory device over time. Therefore, a tighter distribution of the threshold voltages increases read margins between logical LOW and HIGH bits and improves reliability of the memory device over time.

Although a nonlinearly incremented programming voltage may generate a tighter distribution of the threshold voltages than a linearly incremented programming voltage, nonlinearly incremented programming voltage may take longer to program all the memory transistors because it increases the threshold voltages at smaller increments each iteration. However, a proper combination of the initial programming voltage and the nonlinear increments of programming voltages will reduce programming time. The proper combination will ultimately depend on the overall characteristics of the memory transistors that make up each memory device.

Figure 8A:
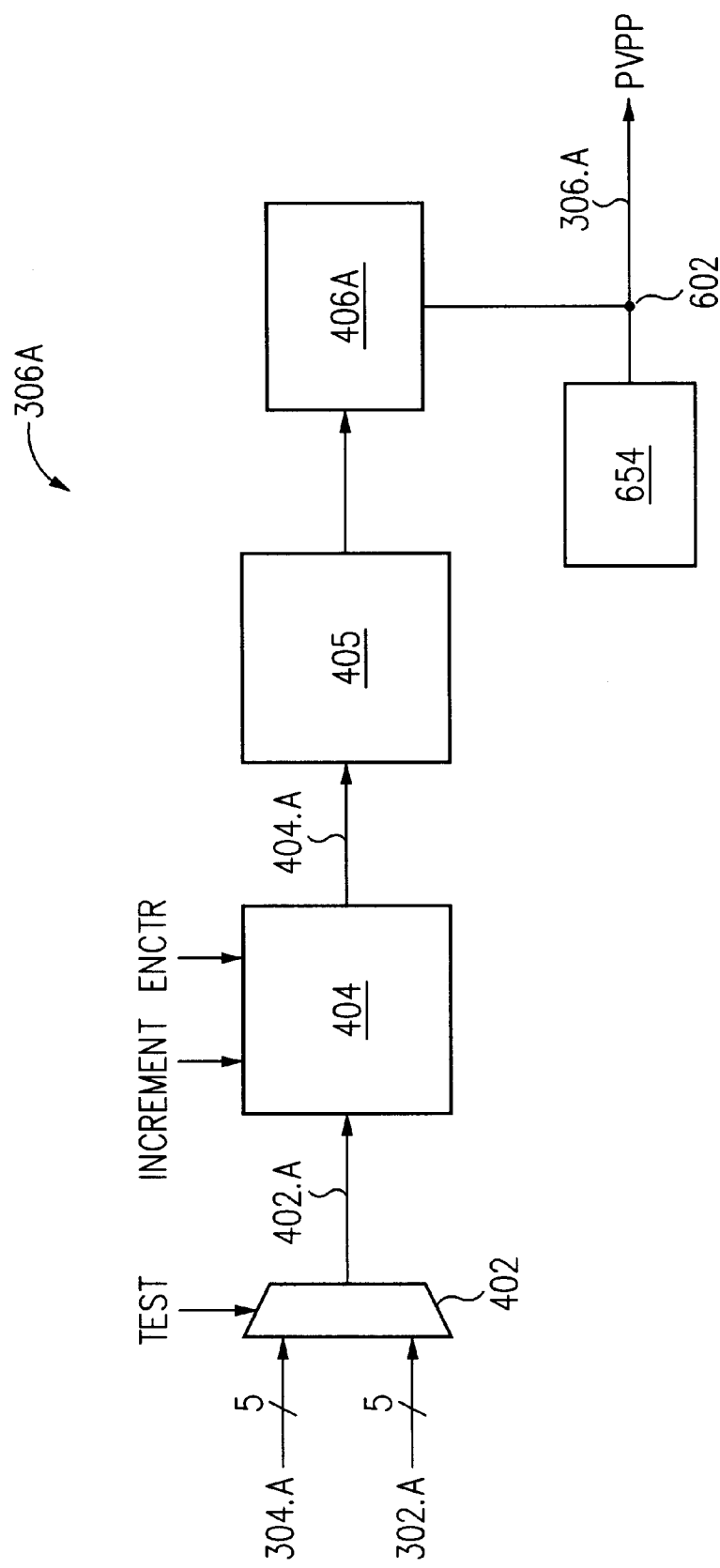
FIG. 8A illustrates a schematic of a voltage circuit used to generate a nonlinear incremented programming voltage in accordance with an embodiment of the present invention.

In one embodiment, program voltage supply circuit 306A, depicted in FIG. 8A, is used to generate a nonlinearly incremented programming voltage. Selector circuit 402, counter circuit 404, and charge pump 654 are described earlier with respect to FIGS. 4 and 6.

Numeric conversion circuit 405 converts voltage value 404.A to a thermometer code signal 405.$A_i$, where i=0 to 31. Thermometer code signal 405.$A_i$ has 32 places and can represents decimal values from 0 to 31. Examples of signals 405.$A_i$ and its corresponding decimal and binary values are listed in the following truth table.

| Decimal value | Binary value: REGC(0) to REGC(4) | Thermometer code: 405.$A_0$ to 405.$A_{31}$ |
|---|---|---|
| 0 | 00000 | 0000000 . . . 00000 |
| 1 | 00001 | 0000000 . . . 00001 |
| 2 | 00010 | 0000000 . . . 00011 |

-continued

| Decimal value | Binary value: REGC(0) to REGC(4) | Thermometer code: 405.A₀ to 405.A₃₁ |
|---|---|---|
| 3 | 00011 | 0000000 ... 00111 |
| 4 | 00100 | 0000000 ... 01111 |
| ... | ... | ... |
| 31 | 11111 | 1111111 ... 11111 |

Signals $405.A_i$ are then provided to voltage regulator circuit 406A.

Voltage regulator circuit 406A controls voltage at node 602 according to signal $405.A_i$. Node 602 is coupled to charge pump 654 and a selected word line of memory array 100.

Figure 8B:
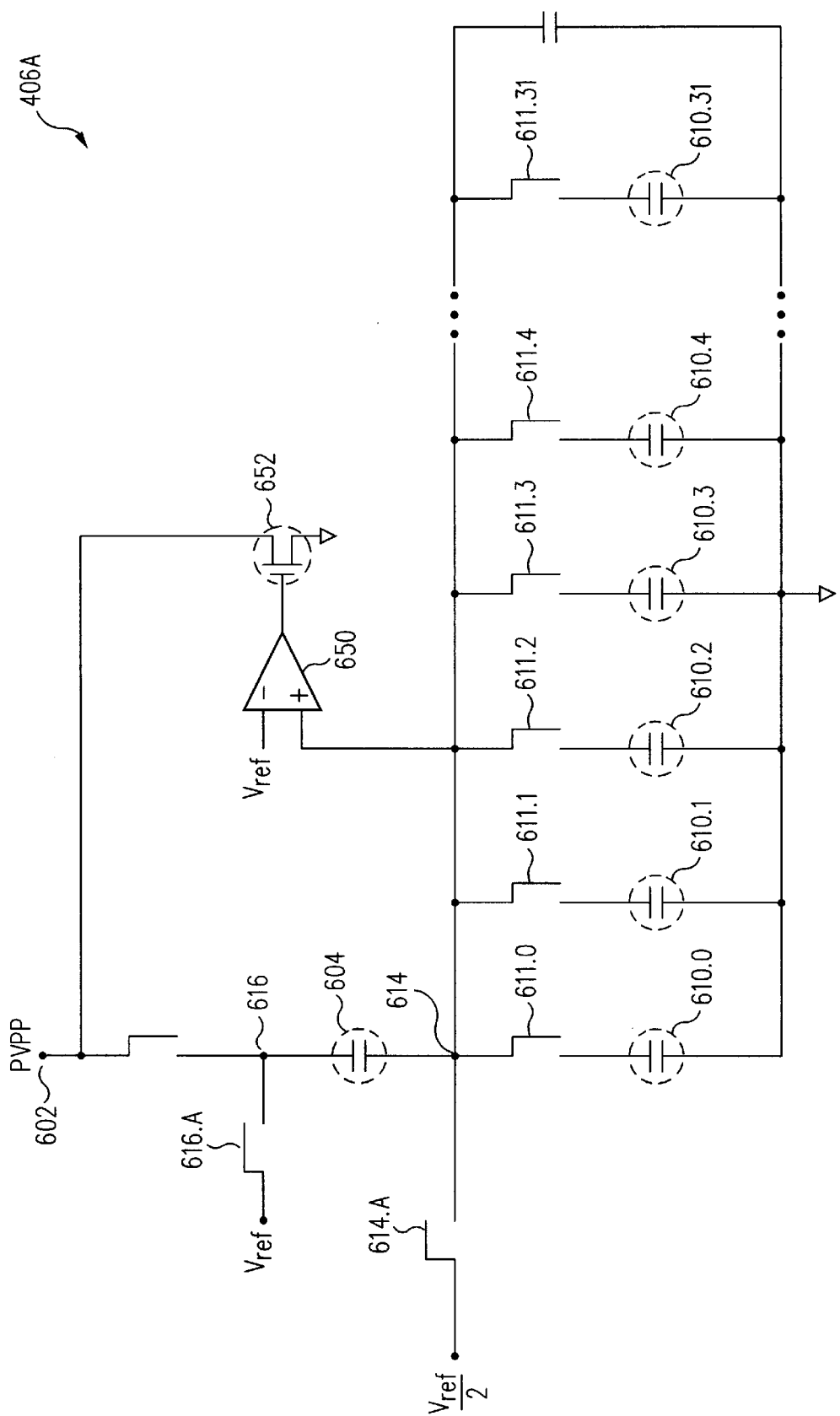
FIG. 8B illustrates a schematic of a program voltage regulator circuit of FIG. 8A in accordance with an embodiment of the present invention.

FIG. 8B depicts a suitable embodiment of program voltage regulator circuit 406A. Program voltage regulator circuit 406A is similar to program voltage regulator circuit 406 except for the additional capacitors (32 total instead of 5 total) and the difference in the capacitance level of the capacitive elements. Switches 611.0 to 611.31 are controlled by thermometer code signal $405.A_0$ to $405.A_{31}$. The capacitance of capacitive elements 610.0 to 610.31 are chosen such that as the value represented by thermometer code signals $405.A_i$ increases, the combined capacitance at node 614 of capacitive elements 610.0 to 610.31 increases in decreasing increments. As an example, the capacitance of capacitive elements 610.28, 610.29, 610.30, and 610.31 may be 32, 31, 30, and 29 of an arbitrary unit. The following table illustrates an exemplary relationship between the combined capacitance of capacitive elements 610.0 to 610.31, thermometer code signals $405A_0$ to $405A_{31}$, and signals REGC(0) to REGC(4).

| Decimal value | Binary value of count: REGC(0) to REGC(4) | Thermometer value of count: 405.A₀ to 405.A₃₁ (last four values) | Combined Capacitance of Capacitive Elements 610.0 to 610.31 |
|---|---|---|---|
| 0 | 00000 | 0000 | 0 |
| 1 | 00001 | 0001 | 32 |
| 2 | 00010 | 0011 | 63 |
| 3 | 00011 | 0111 | 93 |
| 4 | 00100 | 1111 | 122 |

Thus, the combined capacitance at node 614 from the contribution of capacitive elements 610.0 to 610.31 can be increased nonlinearly in decreasing increments for up to 32 steps. Accordingly, the voltage at node 602 is increased nonlinearly in decreasing increments.

Of course the nonlinear incrementing demonstrated herein is merely exemplary; other nonlinear increments can be used.

Erase Voltage Regulator Circuit 308

Figure 9:
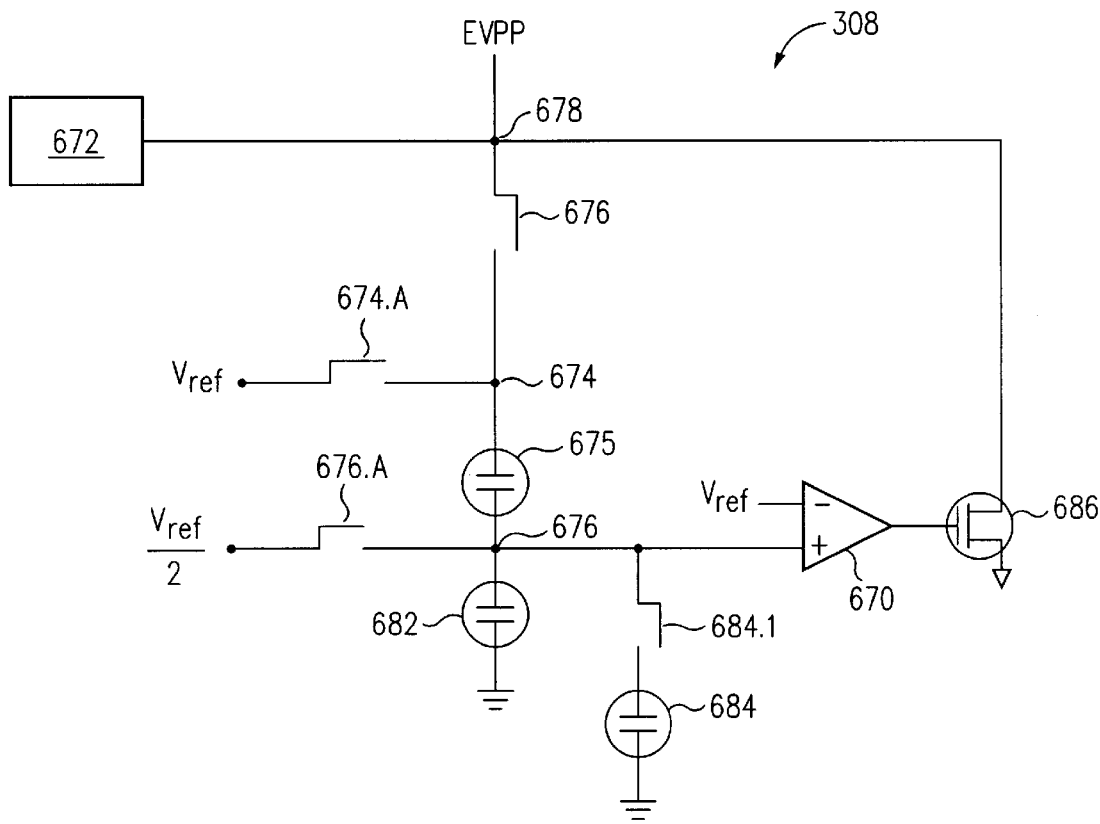
FIG. 9 illustrates a schematic of an erase voltage regulator circuit in accordance with an embodiment of the present invention.

FIG. 9 schematically depicts one embodiment of erase voltage regulator circuit 308 that controls voltage at node 678.

Erase voltage regulator circuit 308 is similar to program voltage regulator circuit 406 (FIG. 6) except it is used to control voltage at node 678 created by charge pump 672 and it has different capacitance of capacitive elements 682 and 684. The capacitance of capacitive element 682 is selected so that a voltage at node 678 will erase all memory cells of a selected block. If the associated voltage does not erase all selected memory cells, switch 684.1 is closed and capacitive element 684 is coupled in parallel with capacitive element 682, thereby increasing the voltage at node 678. Switch 684.1 is controlled by signal 303.A from system logic 303 (FIG. 3).

In another embodiment of erase voltage regulator circuit 308, the structure of program voltage supply circuit 306 (FIGS. 4–6) are duplicated and used as the erase voltage regulator circuit 308. In this embodiment, the initial erase voltage value that controls switches of erase voltage regulator circuit 308 are stored in erase voltage storage element 304.2 (FIG. 3). In this embodiment, capacitance of capacitive elements 604 and 606 are chosen to produce a desired initial erase voltage. In this embodiment, capacitance of capacitive elements 608.0 to 608.4 are chosen to provide a desired incremental erase voltage. It is important to note that while circuit 308 and circuit 306 share the same structure in this embodiment, they are still separate circuits in memory system 300.

Reference Current Source

Of course, though not depicted, a reference current source is used in conventional program and erase verify operations. A suitable method and apparatus to generate a reference current is described in U.S. patent application Ser. No. 09/420,209, entitled "Programmable Current Source," inventors Hollmer et al., filed Oct. 18, 1999, which is incorporated herein by reference in its entirety.

Test Mode Operation

In test mode, a test equipment 302, shown coupled to memory system 300 in FIG. 3, is used. Suitable test equipment 302 is a Hewlett-Packard V3308 or Advantest T5344 or any other suitable memory test system.

Initial Program Voltage Determination

Figure 10A:
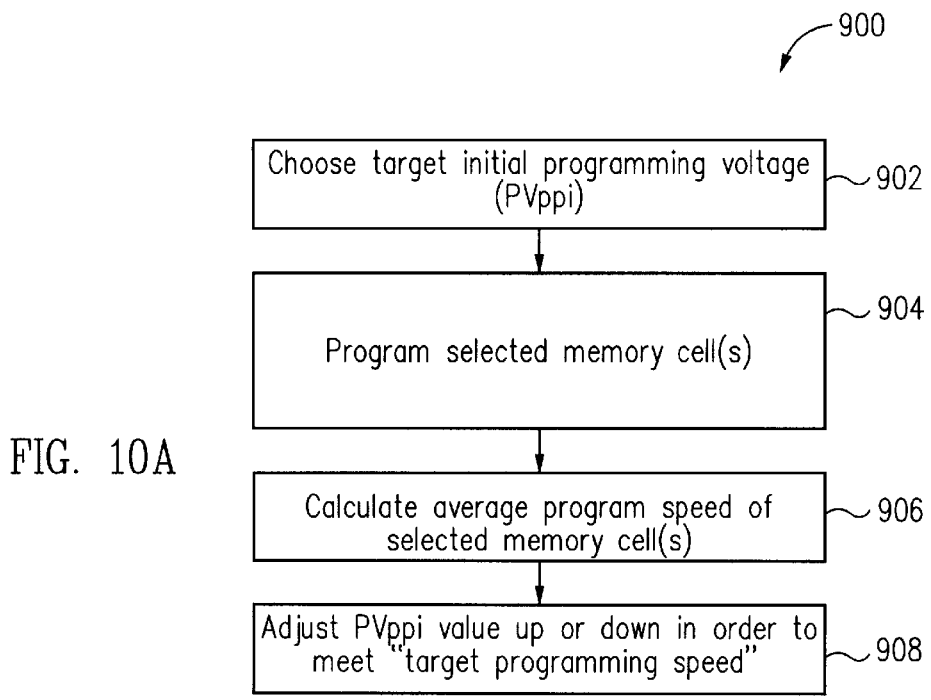
FIG. 10A illustrates a process in a test mode to determine an optimal initial program voltage value in accordance with an embodiment of the present invention.

FIG. 10A depicts a suitable process 900 implemented in test mode to determine an optimal initial program voltage value. In user mode, the optimal initial program voltage value will be used to program any memory cell of memory array 100. Note that the process 900 could easily be adapted, as described in more detail later, to determine an optimal initial erase voltage value.

In action 902, a tester chooses an initial programming voltage (PVPPi).

Figure 10B:
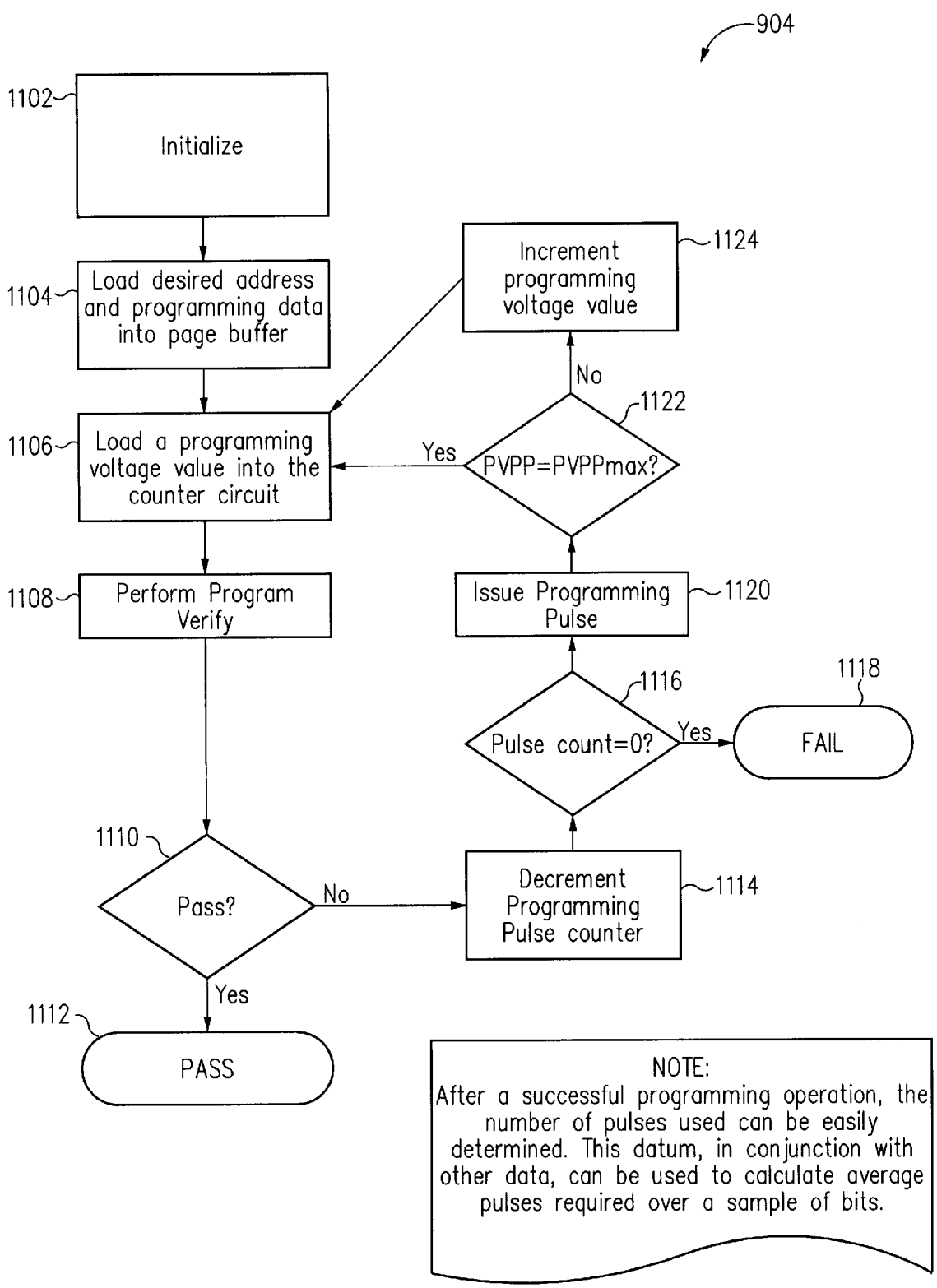
FIG. 10B illustrates a process of programming selected memory cell(s) from the process of FIG. 10A in accordance with an embodiment of the present invention.

In action 904, described in detail with respect to FIG. 10B, test equipment 302 programs a sample memory cell or cells. When multiple memory cells are sampled, action 904 is repeated for each sampled memory cell.

FIG. 10B depicts a suitable action 904 implemented by test equipment 302 in action 904. In action 1102, test software informs test equipment 302 of the initial programming voltage value (PVPPi) and a maximum number of programming pulses. The maximum number of programming pulses, which is stored in a programming pulse counter, represents the maximum number of times to apply a programming voltage to a selected memory cell or cells. The test equipment 302 also loads a suitable reference current from storage circuit 304 into the reference current source.

In action 1104, test equipment 302 specifies which memory cell or cells is/are to be programmed by using an associated latch and sensing circuit. For a suitable associated latch and sensing circuit, see U.S. patent application Ser. No.09/420,209, entitled "Programmable Current Source," inventors Hollmer et al., filed Oct. 18, 1999, which is incorporated herein by reference in its entirety.

In action 1106, test equipment 302 loads the initial programming voltage value into the counter circuit 404 (FIGS. 5A and 5B). In this embodiment, the initial programming voltage value is a 5 bit value.

In action 1108, test equipment 302 commands system logic 303 to perform a program verify. In this embodiment, system logic 303 uses a program verification circuit and method described in U.S. patent application Ser. No. 09/414,750, entitled "Global Erase/Program Verification Apparatus," inventors Hollmer et al., filed Oct. 6, 1999, which is incorporated herein by reference in its entirety.

In action 1110, test equipment 302 determines if the sample memory cell program verified. If the sample memory cell program verified, action 904 ends in action 1112. Otherwise, the next action is 1114.

In action 1112, the number of programming pulses and voltage steps applied to the selected memory cell are recorded. The number of applied programming pulses is the number of times action 1120 executes, while the number of voltage steps is the number of times action 1124 executes.

In action 1114, test equipment 302 decrements the content of the programming pulse counter by one.

In action 1116, test equipment 302 determines if the programming pulse counter stores a value of zero. If the programming pulse counter stores a value of zero, in action 1118, action 904 ends as a failure to program the memory cell within the target number of programming pulses. Subsequently, the tester chooses a new initial program voltage value (PVPPi) which is higher than previously used, and action 904 subsequently repeats using a higher initial program voltage value (PVPPi). Otherwise, the next action is 1120.

In action 1120, test equipment 302 issues a command to system logic 303 (FIG. 3) to apply another programming voltage for a time determined by a programming pulse width to the selected memory cell.

In action 1122, the test equipment 302 determines if the programming voltage value (PVPP) used in action 1106 is equal to a maximum programming voltage value (PVPPmax). The maximum programming voltage value represents a highest voltage that can be applied to memory cell without causing damage. If equal, in action 1106, the maximum programming voltage value is loaded into counter 404 (FIGS. 5A and 5B). Otherwise, action 1124 follows.

In action 1124, the test equipment 302 increases the programming voltage value by an amount equivalent to an approximately 0.1 V to 0.5 V increase and then in action 1106, the incremented programming voltage value is loaded into counter 404 (FIGS. 5A and 5B). Subsequently, actions 1106 to 1110 of process 900 follow.

Referring next to FIG. 10A, in action 906, the average programming speed of the sampled memory cells is determined. The number of times action 1120 is executed represents the programming speed of the selected memory cell. The average programming speed is an average of programming speeds of the selected memory cells.

In action 908, an optimal initial programming voltage is determined. The following equation represents the activity of action 908 to determine an optimal initial programming voltage, $PVPPi_{optimal}$:

$$PVPPi_{optimal} = PVPPi_{used} + V_{increment} * (speed_{average} - speed_{desired}).$$

where $PVPPi_{used}$ is the initial programming voltages used in action 1102;

$V_{increment}$ is an incremental voltage value, typically between 0.1 V and 0.5 V;

$speed_{average}$ is the average programming speed; and $speed_{desired}$ is the desired average programming speed.

Thus if the average programming speed is faster than desired, the average initial programming voltage is decreased. Thus, if the average programming speed is slower than desired, the average initial programming voltage is increased. If the average programming speed is acceptable, the average initial programming voltage is unchanged. The test equipment 302 next stores the optimal initial program voltage into storage element 304.1 (FIG. 3). In this embodiment, the optimal initial program voltage is a 5 bit value.

Thus action 908 selectively adjusts the average initial programming voltage to ensure the programming speed is not too fast or too slow. Too fast a programming speed leads to over-programming of memory cells and rapid degradation and unusability of the cells. Too slow a programming speed means that memory cells will program too slow and may not be commercially usable. Thus process 900 determines an optimal initial programming voltage value for optimal programming of the memory array 100. In user mode, the optimal initial program voltage value will be used to program any memory cell of memory array 100.

In a conventional test mode operation, a power source, which is external to the chip that includes the memory array, is used to determine a suitable program voltage. Consequently, using the conventional technique, the speed to set program voltages is slow, e.g., hundreds of milliseconds per voltage level. The slow speed to determine suitable program voltage increases test time, and hence decreases manufacturing capacity. In this embodiment, test mode uses program voltage supply circuit 306 (FIGS. 3 and 4), located on the same chip as memory system 300 (FIG. 3). Thereby in this embodiment, time to determine a suitable initial programming voltage is much faster than in using conventional designs. Consequently, test times of commercially suppliable memory devices decreases, thereby increasing production capacity without need for additional capital equipment. This results in lower overall product cost.

Initial Erase Voltage Determination

In one embodiment, a similar process as process 900 is used to determine an initial erase voltage value. The following table represents modifications to process 900 to determine an initial erase voltage value:

| Action | Modification |
| --- | --- |
| 902 | Set initial erase voltage. |
| 1102 | Use an initial erase voltage value and set a maximum number of erase pulses. |
| 1104 | Specify which memory cell is to be erased. |
| 1106 | Load an erase voltage value. Use an embodiment of erase voltage regulator circuit 308 that is similar to program voltage supply circuit 306 (FIG. 4). |
| 1108 | Perform erase verification. |
| 1110 | Determine if sample memory cell erase verified. |
| 1112 | Record number of applied erase voltage. |
| 1114 | Decrement content of erase pulse counter. |
| 1116 | Determine if the erase pulse counter stores a zero. |
| 1118 | Subsequently, chose higher initial erase voltage value. |
| 1120 | Issue command to provide another erase voltage. |

-continued

| Action | Modification |
|---|---|
| 1122 | Determine if maximum erase voltage is to be applied. |
| 1124 | Increase erase voltage value. Typically, an erase voltage increment is between 0.5 and 1 V. |
| 906 | Determine average erase speed of the sampled memory cells. |
| 908 | Determine optimal initial erase voltage using average initial erase voltage, average erase speed, erase voltage increment, and desired erase speed. Store the optimal initial erase voltage into storage element 304.2 (FIG. 3). |

Generally, memory cells are less sensitive to stresses from erase operations than program operations because erase responsiveness degrades at a lower rate than program responsiveness. Thus applying an erase voltage that causes too fast an erase speed may not lead to rapid unusability of memory cells. Thus, in one embodiment, the erase and program voltages could begin at different initial values and increase at different rates.

Additional Criteria in Determining Initial Program and Erase Voltage Values

As previously described, certain embodiments of the present invention use incremented step programming, where program pulses of increasing program voltages are applied to program a flash memory device within a reasonable time. In one embodiment of the present invention that uses incremented step programming and non-incremented erasing (i.e., constant erase voltage), the program voltages of the program pulses are selected such that the average of the program voltages is approximately equal to the constant erase voltage of the erase pulse. In this embodiment, approximately equal means that the average of the program voltages is within 1.0 V of the constant erase voltage. It is believed that the symmetry in the voltages slows erase time degradation, thereby extending the usable program/erase cycles of the flash memory device. To achieve such symmetry, the levels of the program voltages may need to be increased. In doing so, program speed may also be improved at the risk of over-programming some flash memory transistors and thereby rendering the flash memory device unusable.

For example, to program a flash memory device within a reasonable time (e.g., less than 300 µS), a set of hypothetical program pulses with the following program voltages are used: PVPPi, (PVPPi+$V_{increment1}$), (PVPPi+$V_{increment2}$), . . . , (PVPPi+$V_{incrementN-1}$), where PVPPi is the initial program voltage, N is the total number of applied program pulses, and $V_{increment1}$, $V_{increment2}$ · · · $V_{incrementN-1}$ are the program voltage increments. Thus, the program voltages of the set of hypothetical program pulses may be selected such that their average is approximately equal to the constant erase voltage ("EVPP") used to erase within a reasonable time (e.g., less than 4 mS). In other words:

$$PVPPi + \frac{V_{increment1} + V_{increment2} + \ldots + V_{incrementN-1}}{N} \cong EVPP.$$

For linearly incremented step programming (i.e., program pulses with program voltages increased in a fix voltage increment), the previously described set of program voltages may be rewritten as: PVPPi, (PVPPi+$V_{increment}$), (PVPPi+$2V_{increment}$), . . . , (PVPPi+(N−1) $V_{increment}$), where $V_{increment}$ is a fix program voltage increment. Thus, PVPPi and $V_{increment}$ may be selected such that the average of the program voltages are approximately equal to EVPP. In other words:

$$PVPPi + \frac{(N-1)!}{N} V_{increment} \cong EVPP.$$

In one embodiment of the present invention, process 900 is used to determine a PVPPi that programs a flash memory device within a reasonable time (e.g., less than 300 µS) using a fix program voltage increment $V_{increment}$. In one implementation of this embodiment, program voltages are generated by program voltage supply circuit 306 (FIG. 4) and the value of $V_{increment}$ determined by the selection of capacitive elements 608.0 to 608.4. An EVPP that erases the flash memory device within a reasonable time (e.g., less than 4 mS) is determined using conventional methods. The above described relationships are then used to evaluate whether the determined PVPPi, the determined EVPP, N, and $V_{increment}$ may extend usable program/erase cycles and improve program speed. If the evaluation is favorable, i.e., if the average program voltage is approximately equal to the constant erase voltage, the determined PVPPi and EVPP may be saved into program voltage storage element 304.1 and erase voltage storage element 304.2 (FIG. 3) and used in user mode to program and erase the flash memory device.

In another embodiment, process 900 is used to determine a PVPPi that programs the flash memory device within a reasonable time using nonlinear increments $V_{increment1}$, $V_{increment2}$ · · · $V_{incrementN-1}$. In one implementation of this embodiment, program voltages are generated by program voltage supply circuit 306A (FIG. 8A) and $V_{increment1}$, $V_{increment2}$ · · · $V_{incrementN-1}$ are determined by the selection of capacitive elements 610.0 to 610.31. A constant EVPP that erases the flash memory device within a reasonable time is determined using conventional methods. The above describe relationships are then used to evaluate whether the determined PVPPi, the determined EVPP, N, and $V_{increment1}$, $V_{increment2}$ · · · $V_{incrementN-1}$ may extend usable program/ erase cycles and improve program speed. If the evaluation is favorable, i.e., if the average program voltage is approximately equal to the erase voltage, the determined PVPPi and EVPP may be saved into program voltage storage element 304.1 and erase voltage storage element 304.2 (FIG. 3) and used in user mode to program and erase the flash memory device.

User Mode

In user mode, typically, a device external to memory system 300 such as a central processing unit (CPU) or memory management unit (MMU) initiates a program or erase operation by signaling a program/erase request and by providing an address to system logic 303. The address specifies subject memory cell(s) of memory array 100.

Figure 11:
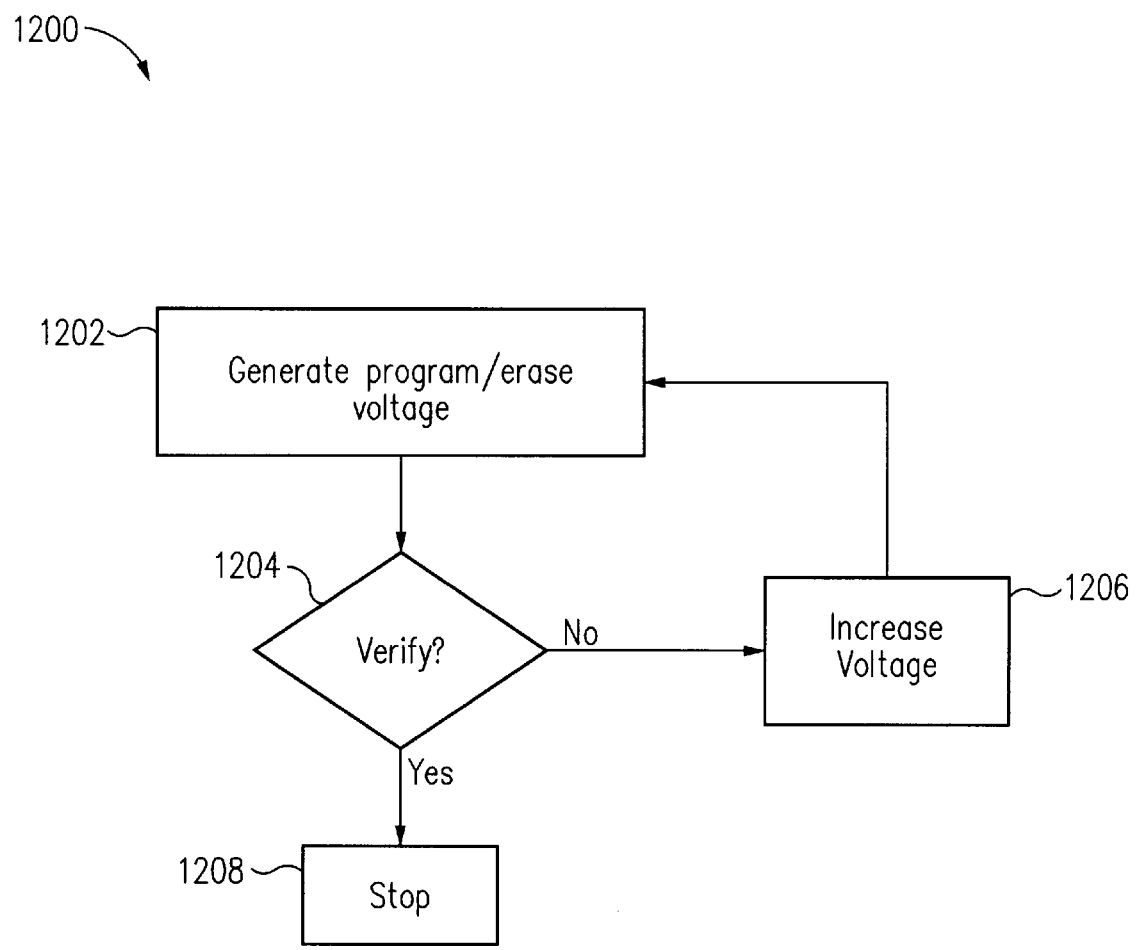
FIG. 11 illustrates a process executed by the memory system of FIG. 3 to perform program/erase operations in user mode in accordance with an embodiment of the present invention.

FIG. 11 depicts an exemplary process 1200 executed by memory system 300 to perform program/erase operations in user mode.

In action 1202, system logic 303 initiates a program or erase operation, whichever is requested. For a program operation,, system logic 303 sets signal TEST to LOW to transfer the initial program voltage value from storage element 304.1 (FIG. 3) as inputs INI(n), where n is 0 to 4, to counter circuit 404 (FIGS. 5A and 5B). Next, system logic 303 sets signal ENCTR to LOW to transfer the initial program voltage value to program voltage regulator circuit 406. System logic 303 next closes switch 604.A (FIG. 6), thereby outputting a program voltage, corresponding to the initial program voltage value, to a word line of memory array 100 that corresponds to the specified address.

In one embodiment, an erase operation uses circuit 308 (FIG. 9). For the embodiment in which an optimal initial erase voltage is determined using a process similar to process 900, in action 1202, the initial erase voltage is generated in a similar manner as the initial program voltage described in the preceding paragraph except the initial erase voltage value is loaded from erase voltage storage element 304.2 (FIG. 3) and an embodiment of erase voltage regulator circuit 308 similar to program voltage regulator circuit 306 (FIG. 4) is used. For an erase operation, the erase voltage is output to the well of array 100.

In action 1204, system logic 303 initiates a program/erase verify operation by issuing a program/erase verify command. A suitable technique to program/erase verify is described in U.S. patent application Ser. No. 09/414,756, entitled "Global Erase/Program Verification Apparatus," inventors Hollmer et al., filed Oct. 6, 1999, which is incorporated herein by reference in its entirety. If all cells that were to be programmed/erased did not successfully program/erase, then action 1206 follows or otherwise action 1208 follows.

In action 1206, for a subsequent program operation, the system logic 303 issues another program command. The conclusion, e.g., falling edge, of second and subsequent program commands causes counter circuit 404 (FIGS. 5A and 5B) to increment the program voltage value coupled to switches 608.0 to 608.4 (FIG. 6). Thus in user mode, the counter circuit 404 increments the program voltage value.

In one embodiment, for a subsequent erase operation, the system logic 303 issues another erase command, which increments the erase voltage value coupled to switches 608.0 to 608.4 (FIG. 6). In one embodiment, for a subsequent erase operation, at the trailing edge of the erase command, the system logic 303 commands switch 676 (FIG. 9) to close, thereby increasing the available erase voltage.

Actions 1202 to 1206 repeat until a program/erase verify occurs (action 1204). In one embodiment, for program operations, the voltage output from program voltage supply circuit 306 (FIG. 4) is increased in equal steps, while in another embodiment, the voltage output from program voltage supply circuit 306 is increased in non-linear, decreasing steps. Similarly for erase operations, the erase voltages increase in non-linear, decreasing steps.

In action 1208 (FIG. 11), for a program operation, after a program verify is detected, system logic 303 stops program voltage supply circuit 306 from applying any subsequent program voltage to memory array 100 by for example turning off charge pump 654 (FIG. 4) and discharging the selected word line of memory array 100.

After an erase verify is detected, system logic 303 stops erase voltage regulator circuit 308 (FIG. 9) from applying any subsequent erase voltage to memory array 100 by for example turning off charge pump 672 (FIG. 9) and discharging the well of memory array 100.

Conclusion

The above-described embodiments of the present invention are illustrative and not limiting. It will thus be obvious to those skilled in the art that various changes and modifications may be made without departing from this invention in its broader aspects. For example, memory array 100 can be a NOR type. Therefore, the appended claims encompass all such changes and modifications as fall within the true spirit and scope of this invention.

What is claimed is:

1. A method for programming and erasing a nonvolatile memory device comprising:

applying a set of program voltages;

applying an erase voltage, wherein the average voltage of the set of program voltages and the erase voltage are within 1.0 V of each other.

2. A method for selecting program voltages and an erase voltage for a nonvolatile memory device comprising:

determining a set of program voltages that programs the nonvolatile memory device within a first specified time;

determining an erase voltage that erases the nonvolatile memory device within a second specified time; and determining if the average voltage of the set of program voltages is approximately equal to the erase voltage.

3. The method of claim 2, wherein the average voltage of the set of program voltages and the erase voltage are within 1.0 V of each other.

4. The method of claim 2, wherein the first specified time is less than 300 $\mu$S.

5. The method of claim 2, wherein the second specified time is less than 4 mS.

6. The method of claim 2, wherein the average voltage of the set of program voltages is $$PVPPi + \frac{V_{increment1} + V_{increment2} + \ldots + V_{incrementN-1}}{N},$$

PVPPi being the initial program voltage, $V_{increment1}$, $V_{increment2}$, ... $V_{incrementN-1}$ being the program voltage increments, and N being the number of applied program pulses.

7. The method of claim 2, wherein the average voltage of the set of program voltages is $$PVPPi + \frac{(N-1)!}{N} V_{increment},$$

PVPPi being the initial program voltage, $V_{increment}$ being a fixed program voltage increment, and N being the number of applied program pulses.

8. The method of claim 6, wherein the first specified time is less than 300 µS and the second specified time is less than 4 mS.

9. The method of claim 7, wherein the first specified time is less than 300 µS and the second specified time is less than 4 mS.

10. The method of claim 2, further comprising:

if the average voltage of the set of program voltages and the erase voltage are approximately equal, applying the set of program voltages or the erase voltage to the memory device.

11. The method of claim 2, further comprising:

if the average voltage of the set of program voltages and the erase voltage are approximately equal, storing the set of program voltages or the erase voltage in the memory device.

12. The method of claim 2, wherein the set of program voltages are derived from an initial program voltage.

13. The method of claim 12, further comprising:

if the average voltage of the set of program voltages and the erase voltage are approximately equal, storing the initial program voltage in the memory device.

* * * * *